(12) United States Patent
Ogawa et al.

(10) Patent No.: US 8,097,534 B2
(45) Date of Patent: Jan. 17, 2012

(54) METHOD FOR MANUFACTURING SEMICONDUCTOR DEVICE AND STORAGE MEDIUM

(75) Inventors: Shuhei Ogawa, Albany, NY (US); Shin Hirotsu, Nirasaki (JP)

(73) Assignee: Tokyo Electron Limited, Tokyo-To (JP)

(*) Notice: Subject to any disclaimer, the term of this patent is extended or adjusted under 35 U.S.C. 154(b) by 700 days.

(21) Appl. No.: 12/222,442

(22) Filed: Aug. 8, 2008

(65) Prior Publication Data

US 2009/0047794 A1    Feb. 19, 2009

Related U.S. Application Data

(60) Provisional application No. 60/996,023, filed on Oct. 25, 2007.

(30) Foreign Application Priority Data

Aug. 10, 2007   (JP) .................................. 2007-210229

(51) Int. Cl.
   *H01L 21/4763*    (2006.01)

(52) U.S. Cl. ........ 438/618; 438/620; 438/622; 438/623; 438/624; 438/637

(58) Field of Classification Search ........................ None
See application file for complete search history.

(56) References Cited

U.S. PATENT DOCUMENTS 4,473,437 A * 9/1984 Higashikawa et al. ......... 216/67

FOREIGN PATENT DOCUMENTS

JP       2002-16050       1/2002
JP       2003-219558      7/2003

* cited by examiner

*Primary Examiner* — Duy Deo
(74) *Attorney, Agent, or Firm* — Smith, Gambrell & Russell, LLP

(57) ABSTRACT

On an etching target film formed on a substrate, a three-layer resist is laminated. This three-layer resist includes an organic film and a resist film developed into a resist pattern. Through the resist pattern, the organic film is etched into a mask pattern through which the etching target film will be etched.

The organic film is etched with plasma which is obtained by exciting a process gas containing carbon dioxide and hydrogen to the plasma state. This scheme makes it possible to form a high perpendicularity mask pattern in the organic film.

4 Claims, 9 Drawing Sheets

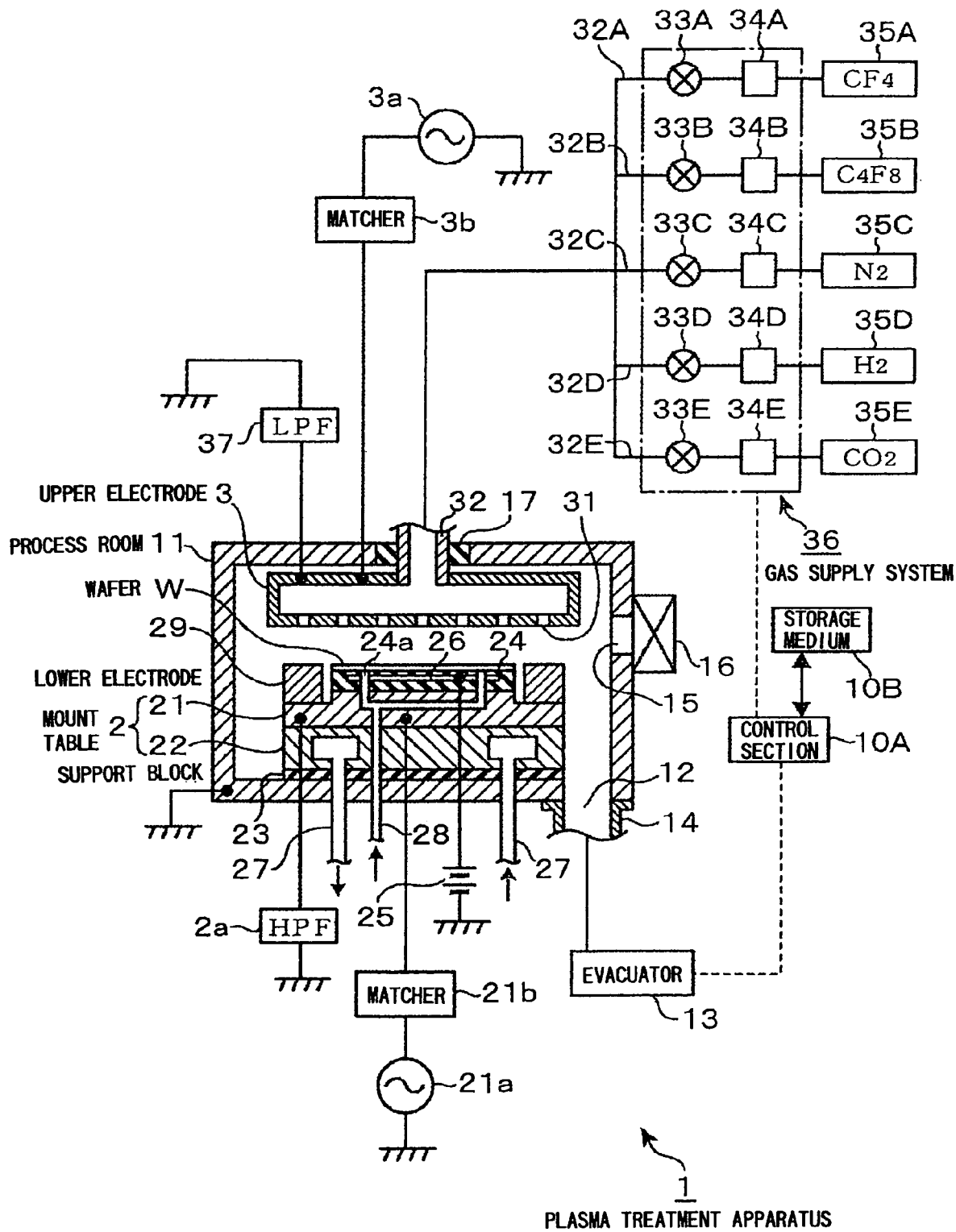
F I G . 1

METHOD FOR MANUFACTURING SEMICONDUCTOR DEVICE AND STORAGE MEDIUM

CROSS-REFERENCE TO RELATED APPLICATIONS

The present patent application claims the benefit of JP Application 2007-210229, filed on Aug. 10, 2007, and U.S. Provisional Application No. 60/996,023, filed on Oct. 25, 2007. The entire disclosure of these prior applications is incorporated into the present specification by reference.

BACKGROUND OF THE INVENTION

1. Field of the Invention

The present invention relates to a technique to etch an organic film, which constitutes part of a multi-layered resist, into a mask pattern through which the objective film is etched.

2. Description of the Related Art

In the manufacture of semiconductor devices, metal interconnects formed in inter-layer insulation films made of, for example, oxide silicon ($SiO_2$) are becoming finer and finer. To cope with this trend toward finer interconnects, a three-layer resist is formed in some cases. The three layers are, for example, an organic film, a $SiO_2$ film by the SOG (Spin On Glass) method, and a photoresist film which are formed in this order on the insulation film.

Specifically, interconnects are formed by using this three-layer resist as described here. After the photoresist film is formed into a resist pattern by photolithography, the $SiO_2$ film is etched through this resist pattern to form a mask pattern having side walls inclined so that the apertures narrow with depth. Then, after the lower organic film is etched according to the mask pattern to form the organic film into a mask pattern, the insulation film is etched according to the patterns formed from the respective layers. Consequently, recesses are formed as contact holes and via holes where fine interconnect lines, narrower than those of the resist pattern, will be buried. Conventionally, $O_2$ gas in the plasma state is used to etch the organic film.

In order to further improve semiconductor devices in operation speed, it is demanded to lower the relative dielectric constants of interlayer insulation films. Instead of conventionally used $SiO_2$, a lower dielectric constant porous film which contains silicon, carbon, oxygen, and hydrogen (SiCOH film) is sometimes used as an interlayer insulation film. However, this SiCOH film is liable to be damaged if exposed to oxygen plasma. In addition, if plasma $O_2$ gas is used to etch the organic film, the organic film is etched isotropically. In other words, since etching by generated oxygen (O) radicals is active not only downward but also laterally, the organic film has such a bowing profile that each sidewall of the pattern, when viewed in vertical section, is laterally widened like a bow, resulting in a mask pattern with poor perpendicularity sidewalls. If the mask pattern has such a bowing profile, it may be impossible to form sufficiently narrow interconnect lines in the insulation film since the insulation film is etched wider.

Accordingly, the present inventors made an accumulative study of the etching gas and contrived the use of $CO_2$ gas plasma to etch the organic film. Use of $CO_2$ gas plasma is effective since it can not only suppress damage to the SiCOH film but also reduce the generation of oxygen radicals as compared with $O_2$ gas plasma and consequently suppress isotropic etching of the organic film. Since the mask pattern formed from the organic film does not have a considerable bowing profile, it is possible to accurately control the etching width when the organic film and the lower insulation film is etched. With the progress of interconnects in minuteness, however, etching of the organic film is demanded to meet still higher perpendicularity requirements. In the use of $CO_2$ gas plasma it is becoming difficult to suppress the occurrence of bowing profile sufficiently enough to meet this demand.

Etching of low dielectric constant films by use of a gas composed of $H_2$ and $CO_2$ is disclosed in JP-A-2002-16050. Unlike the present invention, however, there is no mention of etching an organic film of a multi-layered resist in forming a mask.

SUMMARY OF THE INVENTION

The present invention was made in order to solve the above-mentioned problem. It is an object of the present invention to provide a semiconductor device manufacturing method capable of forming an organic film, which is laminated on an etching target film on a substrate, into a high perpendicularity mask pattern, through a resist pattern formed from a resist film laminated on the organic film, for use as an etching mask for the etching target film. It is another object of the present invention to provide a storage medium having the semiconductor device manufacturing method stored therein.

The present invention provides a method for manufacturing a semiconductor device which includes the steps of: preparing a substrate provided with an etching-target film thereon and a multi-layered resist on the etching-target film, including an organic film and a resist film developed into a resist pattern; and forming the organic film of the multi-layered resist into a mask pattern by etching the organic film through the resist pattern of the resist film wherein plasma obtained by exciting a process gas containing carbon dioxide and hydrogen to the plasma state is used to etch the organic film and the mask pattern of the organic film is to be used in etching the etching-target film.

A low dielectric constant film which has a recess and contains silicon, carbon, oxygen, and hydrogen may be formed on the etching-target film on the substrate and the organic film may be buried in the recess of the low dielectric constant film. The organic film may be a sacrificial film.

The recess of the low dielectric constant film may become a via hole where an electrode is buried to connect an upper interconnect layer and a lower interconnect layer in a multi-layered interconnection structure.

The organic film may be composed mainly of carbon.

In addition, the present invention provides a storage medium where a computer program for a computer to implement a semiconductor device manufacturing method is stored, wherein the semiconductor device manufacturing method includes the steps of: preparing a substrate provided with an etching-target film thereon and a multi-layered resist on the etching-target film, including an organic film and a resist film developed into a resist pattern and is laminated on the etching-target film; and forming the organic film of the multi-layered resist into a mask pattern by etching the organic film through the resist pattern of the resist film wherein plasma obtained by exciting a process gas containing carbon dioxide and hydrogen to the plasma state is used to etch the organic film and the mask pattern of the organic film is to be used in etching the etching-target film.

According to the present invention, as apparent from experimental results mentioned later, it is possible to form an organic film, which constitutes a part of a multi-layered resist, into a high perpendicularity mask pattern by etching the organic film with plasma which is created by exciting a process gas containing carbon dioxide and hydrogen.

BRIEF DESCRIPTION OF THE DRAWINGS

FIG. 1 is a vertical sectional view showing an example of a plasma treatment apparatus in which a semiconductor device manufacturing method of the present invention is carried out.

DESCRIPTION OF THE PREFERRED EMBODIMENTS

Figure 2:
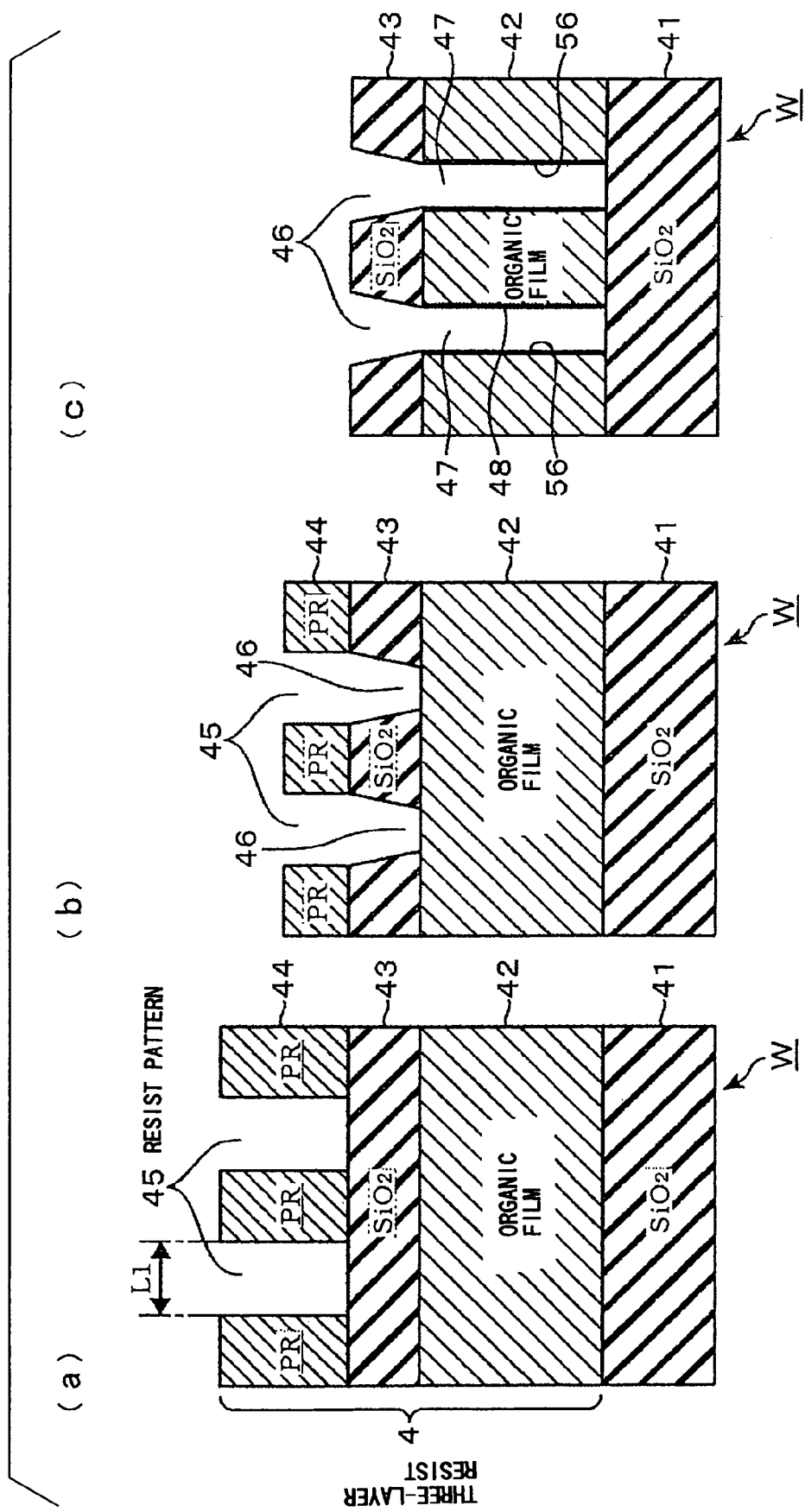
FIGS. 2(a)-2(c) are process diagrams showing how a wafer provided with a three-layer resist is etched by using the semiconductor device manufacturing method of the present invention.

With reference to FIG. 1, the following firstly describes an example of a plasma treatment apparatus in which a semiconductor device manufacturing method of the present invention is carried out. The plasma treatment apparatus 1 shown in FIG. 1 comprises, for example, a process room (process chamber) 11, or a vacuum chamber having an enclosed space therein, a mount table 2 disposed in the center of the bottom of the process room 11 and an upper electrode 3 disposed over the mount table 2 so as to face the mount table 2.

The process room 11 is electrically grounded. In addition, via an exhaust pipe 14 connected with an exhaust port 12 of the bottom, the process room 11 communicates with an evacuator 13. This evacuator 13 is connected with a pressure regulator not shown in the figure. This pressure regulator is configured so as to keep the inside of the process room 11 at a desired degree of vacuum by evacuating the process room 11 according to a signal from a control section 10A described later. A wall of the process room 11 is provided with a wafer W transport gate 15 which can be opened and closed by a gate valve 16.

The mount table 2 comprises a lower electrode 21 and a support block 22 to support the lower electrode 21 from below and is disposed on the bottom of the process room 11 via an insulating member 23. An electrostatic chuck 24 is provided on the top of the mount table 2. A wafer W is mounted on the mount table 2 via this electrostatic chuck 24. The electrostatic chuck 24 is made of dielectric material and contains an electrode foil 26 which is connected to a high voltage dc power supply 25. When voltage is applied to this electrode foil 26 from the high voltage dc power supply 25, static electricity is generated on the surface of the electrostatic chuck 24 and the mounted wafer W on the mount table 2 is electrostatically fixed to the electrostatic chuck 24. The electrostatic chuck 24 has through holes 24a formed therein to release a back side gas upward from the electrostatic chuck 24 as described later.

The mount table 2 has a coolant flow passage 27 formed therein to flow a coolant (for example, such a widely known conventional one as fluorinated liquid, water or the like). A coolant flowing through this coolant flow passage 27 cools the mount table 2 so that the wafer W mounted on the mount table 2 is cooled down to a desired temperature via the mount table 2. In addition, a temperature sensor not shown in the figure is attached to the lower electrode 21. By this temperature sensor, the temperature of the wafer W on the lower electrode 21 is continuously monitored.

In addition, the mount table 2 has a gas passage 28 formed therein to supply a heat transfer gas such as He (helium) gas as the backside gas. This gas passage 28 is opened in plural places at the top of the mount table 2. These openings communicate with the through holes 24a so that the backside gas supplied into the gas passage 28 is released upward from the electrostatic chuck 24 via the through holes 24a. This backside gas diffuses uniformly throughout the space between the electrostatic chuck 24 and the wafer W mounted on the electrostatic chuck 24, which enhances the heat transfer in this space.

The lower electrode 21 is grounded via a high pass filter (HPF) 2a. A high frequency power supply 21a of, for example, 13.56 MHz is also connected to the lower electrode 21 via a matcher 21b. In addition, the lower electrode 21 is circumferentially provided with a focus ring 29 to surround the electrostatic chuck 24 so that generated plasma is focused to the wafer W on the mount table 2 via the focus ring 29.

The upper electrode 3 is a hollow gas shower head having many holes 31 formed uniformly through the bottom surface thereof in order to disperse/supply the process gas into the process room 11. The upper electrode 3 has a gas inlet pipe 32 extended from the central part of the upper surface. This gas inlet pipe 32 passes through the central upper wall of the process room 11 via an insulating member 17. The upstream side of this gas inlet pipe 32 branches into, for example, five branch pipes 32A-32E which are respectively connected with gas supply sources 35A-35E via valves 33A-33E and flow control sections 34A-34E. These valves 33A-33E and flow control sections 34A-34E constitute a gas supply system 36 which can adjust and stop each gas flow from the gas supply sources 35A-35E according to a control signal from the control section 10A as described later. In this example, the gas supply sources 35A, 35B, 35C, 35D, and 35E supply $CF_4$ gas, $C_4F_8$ gas, $N_2$ gas, $H_2$ gas, and $CO_2$ gas, respectively.

The upper electrode 3 is grounded via a low pass filter (LPF) 37. To this upper electrode 3, a higher frequency power supply 3a of, for example, 60 MHz is also connected via a matcher 3b. The high frequency from the high frequency power supply 3a connected with the upper electrode 3 is to excite the process gas to the state of plasma whereas the high frequency from the high frequency power supply 21a connected with the lower electrode 21 is to attract ions from the plasma to the surface of the wafer W by applying the bias voltage to the wafer W. Note that the high frequency power supplies 3a and 21a are respectively connected with the control section 10A and, according to control signals therefrom, the powers to be supplied to the upper electrode 3 and the lower electrode 21 are controlled.

For example, the control section 10A of this plasma treatment apparatus 1 is a computer and includes a data processor comprising a program, memory, and CPU.

Instructions are incorporated in the program so that the control section 10A sends control signals to individual sections of the plasma treatment apparatus 1 sequentially on an each step-basis in order to give plasma treatment to the wafer W. In addition, the memory may have a region where pressure, time, gas flow, power, and other process parameter values are written. In this case, each time an instruction of the program is executed, the CPU reads some of these process parameters and sends control signals depending on their parameter values to individual sections of the plasma treatment apparatus 1. This program is stored in a computer-oriented storage medium 10B such as a flexible disk, compact disk or MO (magneto-optic disk) and installed in the control section 10A from the storage medium 10B (includes programs on input operations and display for process parameters).

With reference to FIG. 2(*a*), the following describes film structures formed on the surface of a semiconductor wafer (hereinafter called a wafer) W before this wafer or substrate is processed in the plasma treatment apparatus 1. On the wafer W, an insulating $SiO_2$ film 41 is deposited by using TEOS (Tetraethoxysilane) as the film-forming material. On this $SiO_2$ film 41, for example, an organic film 42 is deposited to a thickness of 200 nm. The organic film 42 is composed mainly of carbon. Its carbon content is, for example, 80% by mass at least.

On the organic film 42, a $SiO_2$ film 43 with a thickness of, for example, 70 nm is formed by the SOG (Spin On Glass) method. On the $SiO_2$ film 43, a photoresist (PR) film 44 is formed with a thickness of, for example, 150 nm. In this example, a three-layer resist (multi-layered resist) 4 is formed by depositing the organic film 42, the $SiO_2$ film 43, and the photoresist film 44. The organic film 42 constitutes the lowest layer of the three-layer resist 4.

After exposed to an ArF light source, the photoresist film 44 is developed into a resist pattern 45 whose line width (CD) indicated by L1 in the figure is, for example, 65 nm. At the bottom of the resist pattern 45, the $SiO_2$ film 43 is exposed. The $SiO_2$ film 43 not only functions as a hard mask but also functions to make the organic film 42 etching width narrower than CD of the resist pattern 45 since each aperture of the mask pattern 46 formed by etching the $SiO_2$ film 43 through the resist pattern narrows with depth as described later.

As mentioned above, the wafer W has the $SiO_2$ film 41 as the film to be etched and the three-layer resist 4 which is laminated on the $SiO_2$ film 41 and comprises the organic film 42, the $SiO_2$ film 43, and the photoresist film 44.

The following describes how a semiconductor device manufacturing method of the present invention is implemented using the plasma treatment apparatus 1. Firstly, the gate valve 16 is opened and the 300 nm (12 inch) wafer W provided with the above-mentioned film structure is carried into the process room 11 by a transport mechanism not shown in the figure. Then, this wafer W is horizontally set on the mount table 2 and electrostatically fixed to the mount table 2. Then, after the transport mechanism is withdrawn from the process room 11, the gate valve 16 is closed. Then, the backside gas is supplied from the gas passage 28 to control the temperature of the wafer W so that its highest part, middle part and lowest part are kept at certain temperatures, for example, 60, 60, and 20 degrees C., respectively. Then, the following steps may be performed.

(Step 1: Etching the $SiO_2$ Film 43)

While the process room 11 is evacuated by the evacuator 13 via the exhaust pipe 14, $CF_4$ gas and $C_4F_8$ gas are supplied at, for example, 200 sccm and 5 sccm respectively from the gas supply system 36 to the surface of the wafer W via the upper electrode 3. The inside of the process room 11 is kept at a certain vacuum, for example, 20 Pa (150 mTorr). Then, a high frequency voltage of 60 MHz for plasma generation is applied at, for example, 500 W to the upper electrode 3 from the high frequency power supply 3*a* via the matcher 21*b* to excite the $CF_4$ gas and $C_4F_8$ gas to the plasma state. Concurrently, a high frequency bias voltage of 13.56 MHz is applied at, for example, 400 W to the lower electrode 51 from the high frequency power supply 21*a* via the matcher 21*b*.

The $SiO_2$ film 43 is etched through the resist pattern 45 of the photoresist film 44 as a mask by active carbon (C)/fluorine (F) compound species contained in the plasma $SiO_2$ film 43. This forms a mask pattern 46 developed in the depth direction and etches the surface of the photoresist film 44. Since the active species are not apt to etch the $SiO_2$ in lateral directions, the apertures of the mask pattern 46 narrow with depth. When the organic film 42 is exposed at the bottom of the mask pattern 46 as shown in FIG. 2(*b*), the etching is terminated by stopping high frequency power supply from the high frequency power supplies 21*a* and 3*a* and gas supply from the gas supply system 36.

(Step 2: Etching the Organic Film 42)

Then, after the remaining $CF_4$ gas and $C_4F_8$ gas are removed by evacuating the process room 11 at a certain rate by the evacuator 13, $CO_2$ gas, $H_2$ gas, and $N_2$ gas are supplied at, for example, 200 sccm, 200 sccm, and 200 sccm respectively from the gas supply system 36 into the process room 11 via the upper electrode 3 while the evacuation rate is controlled to a certain rate. The inside of the process room 11 is kept at a certain vacuum, for example, 2.0 Pa (15 mTorr). Then, a high frequency voltage of 60 MHz for plasma generation is applied at 700 W to the upper electrode 3 from the high frequency power supply 3*a* via the matcher 21*b* to excite the $CO_2$ gas, $H_2$ gas, and $N_2$ gas to the plasma state. Concurrently, a high frequency bias voltage of 13.56 MHz is applied at, for example, 400 W to the lower electrode 21 from the high frequency power supply 21*a* via the matcher 21*b*.

Carbon dioxide ions ($CO_2^+$) included in the plasma react with the organic material of the photoresist film 44 and the organic film 42 according to formula (I) below but are not apt to react with $SiO_2$. Therefore, the generated plasma etches off the photoresist film 44 and etches the organic film 42 through the mask pattern 46 of the $SiO_2$ film as a mask, resulting in a mask pattern 47 formed.

$$CO_2^+ + C \rightarrow 2CO \qquad (1)$$

Figure 3:
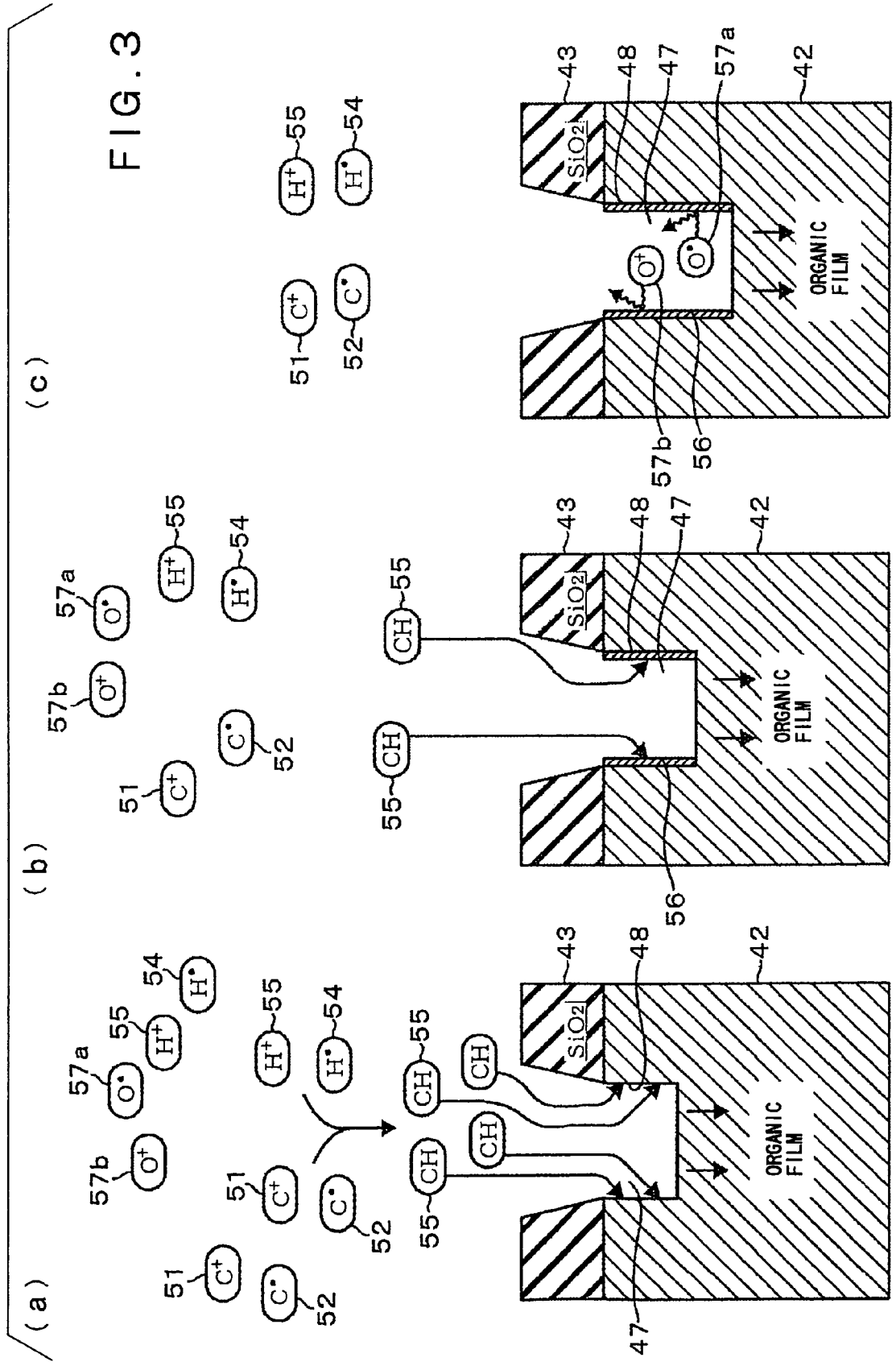
FIGS. 3(a)-3(c) are diagrams for explaining how sidewalk of an organic film included in the three-layer resist is protected.

The mask pattern 47 extends in the depth direction and leaves high perpendicularity sidewalls 48. The reason for the high perpendicularity of the sidewalls 48 is as follows. Carbon ions 51 and carbon radicals 52 generated from the carbon dioxide gas and hydrogen ions 53 and hydrogen radicals 54 generated from the hydrogen gas combine to generate CH-based polymer components 55 (FIG. 3(*a*)). While the mask pattern 47 is formed downward, these polymer components 55 stick to the surface of the sidewall 48 and forms a protect film 56 thereon (FIG. 3(*b*)). Then, this protect film 56 suppresses the lateral etching of the sidewall 48 by O radicals 57*a* and oxygen ions 57*b* which are generated from the carbon dioxide gas (FIG. 3(*c*)).

Figure 4:
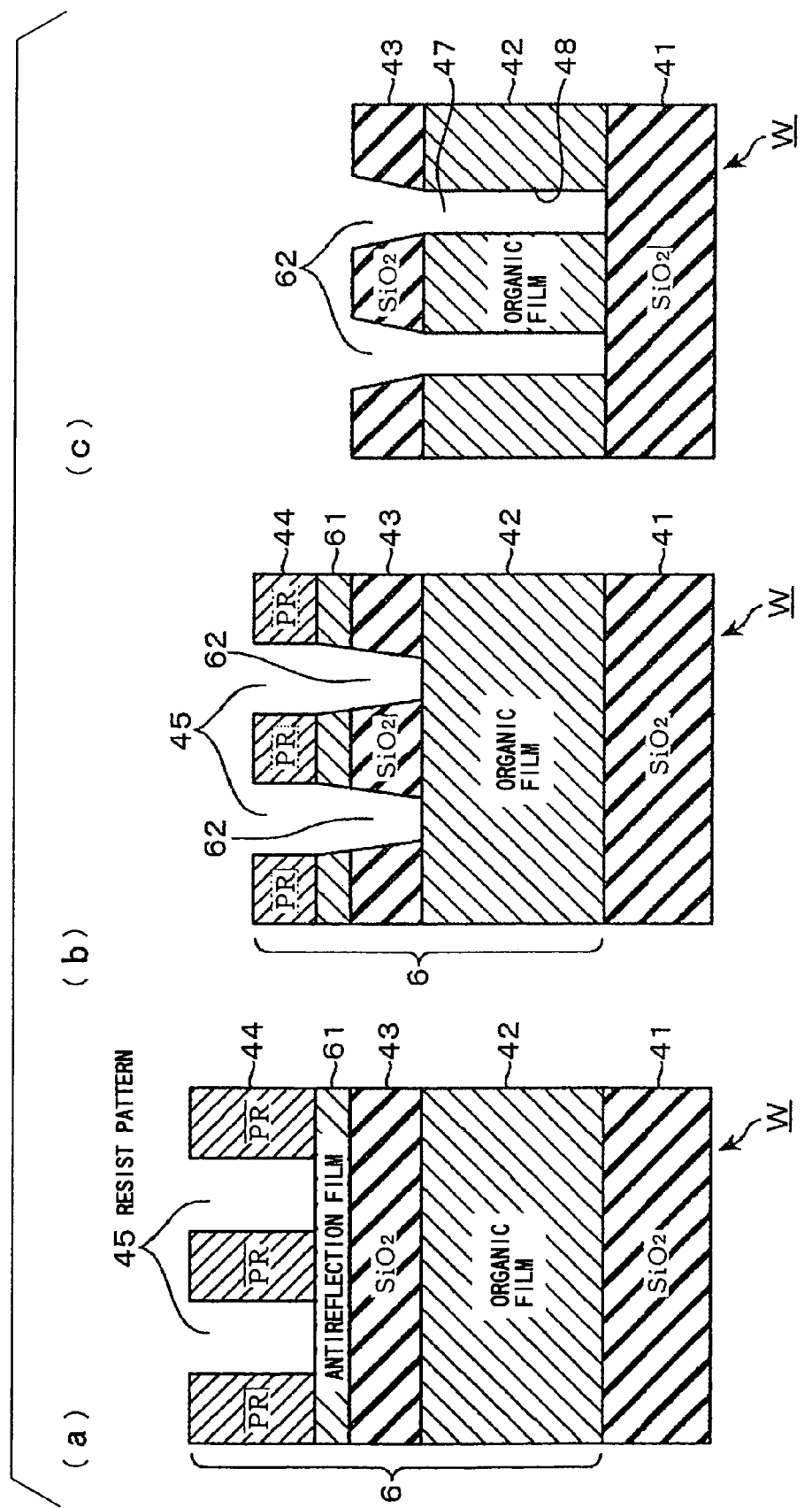
FIGS. 4(a)-4(c) are process diagrams showing a four-layer resist is etched by using the semiconductor device manufacturing method of the present invention.

When the $SiO_2$ film 41 is exposed at the bottom of the mask pattern 47 as shown in FIG. 4(*c*), the etching is terminated by stopping high frequency power supply from the high frequency power supplies 21*a* and 3*a* and gas supply from the gas supply system 36. Then, the $SiO_2$ film 41 may be etched via the mask pattern 47 on a certain etching condition to form recesses therein. An interconnection metal, for example, copper is buried in these recesses.

According to the above-mentioned embodiment, the mask pattern 47 used to etch the $SiO_2$ film 41 below the organic film 42 is formed by etching the organic film 42 with plasma containing a mixed gas of $CO_2$ and $H_2$ through the mask pattern 46 formed from the $SiO_2$ film 43 through the resist pattern 45. Due to this manner, the mask pattern 47 is formed so as to have high perpendicularity sidewalls 48 as apparent from the result of an experiment described later. Thus, it is possible to suppress the widening of recesses formed in the $SiO_2$ film 41 when the $SiO_2$ film 41 is etched by using the mask patterns 46 and 47. It is therefore possible to bury narrower interconnect lines therein. In addition, as apparent from the result of the experiment described later, it is possible to prevent the mask patterns 46 and 47 from having what is called corner rounding. If corner rounding occurs, each opening becomes remarkably wider at the top as compared with its width at the lowest or middle height. Suppressing such corner rounding is preferable since leak current between laterally spaced interconnect lines is lowered.

In addition, the three-layer resist 4 in the above-mentioned embodiment has the $SiO_2$ film 43 formed as an intermediate layer between the resist film 44 and the organic film 42. The mask pattern 46 formed from this $SiO_2$ film 43 is such that each aperture narrows with depth. Since the organic film 42 is etched via this mask pattern 46, it is possible to further suppress the widening of each aperture in the mask pattern 47.

The multi-layered resist is not necessary to be of the three-layer structure. It is also possible to use a four-layer structure as shown in FIG. 4(a). This four-layer resist 6 may have an antireflection organic film 61 formed between the $SiO_2$ film 43 and the resist film 44. The following describes the process of etching this four-layer resist 6. Firstly, like step 1 in the above-mentioned embodiment, the antireflection film 61 and the $SiO_2$ film 43 are successively etched through the resist pattern 45 of the photoresist 44 as a mask by using plasma generated from $CF_4$ and other gases. These films 61 and 43 are formed into such a mask pattern 62 (FIG. 4(b)) that each aperture narrows with depth in the same manner as the mask pattern 46. Then, like step 2 in the above-mentioned embodiment, the organic film 42 is etched via the mask pattern 62 to form a mask pattern 47. Thus, use of such a four-layer resist 6 also attains the same effect as by the above-mentioned embodiment.

Figure 5:
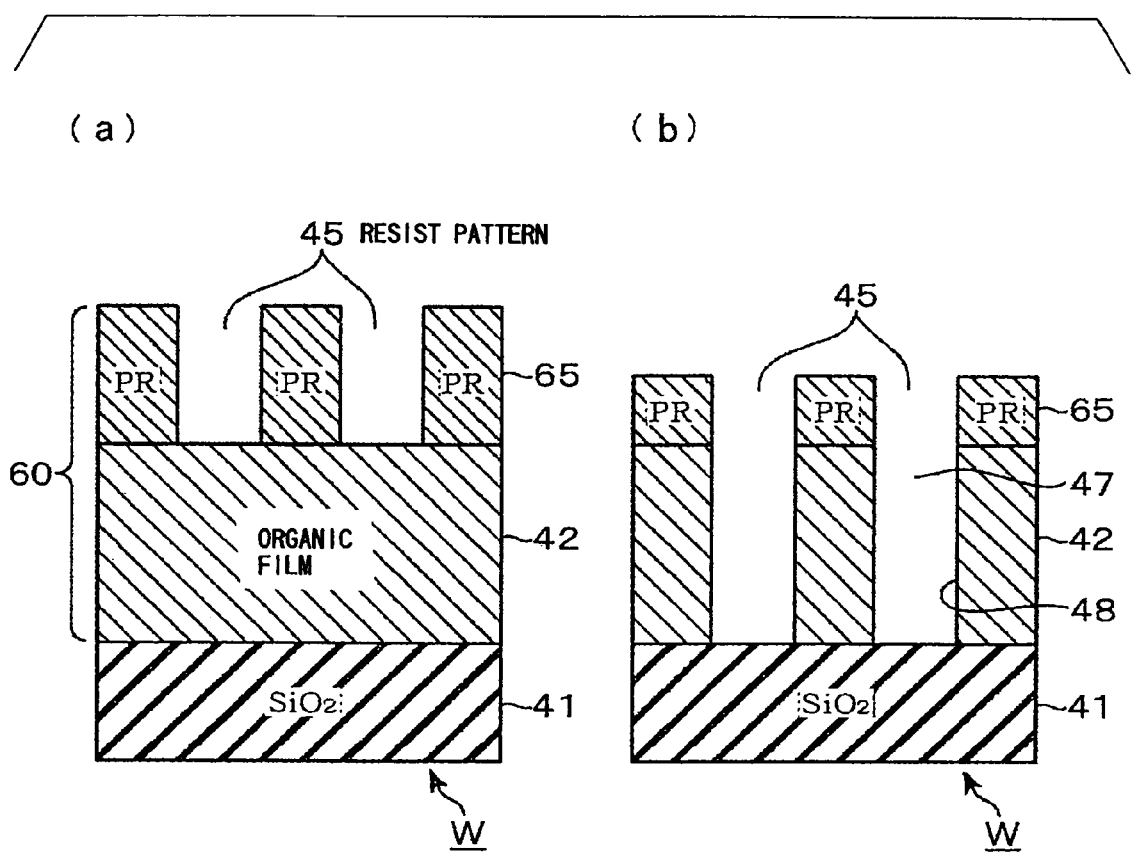
FIGS. 5(a) and 5(b) are process diagrams showing a two-layer resist is etched by using the semiconductor device manufacturing method of the present invention.

As well, the multi-layered resist may be of the two-layer structure as shown in FIG. 5(a). This two-layer resist 60 comprises an organic film 42 and a photoresist film 65 stacked thereon. A resist pattern 45, formed from the photoresist film 65, serves as a mask when the organic film 42 is etched. In addition, the photoresist film 65 contains a greater amount of Si (silicon) than the photoresist film 44 in order to prevent the organic film 42 from being etched off excessively. This two-layer resist 60 is etched according to the procedure of step 2 in the previously mentioned embodiment. As shown in FIG. 5(b), a mask pattern 47 is formed from the organic film 42 without laterally widening the apertures.

Figure 6:
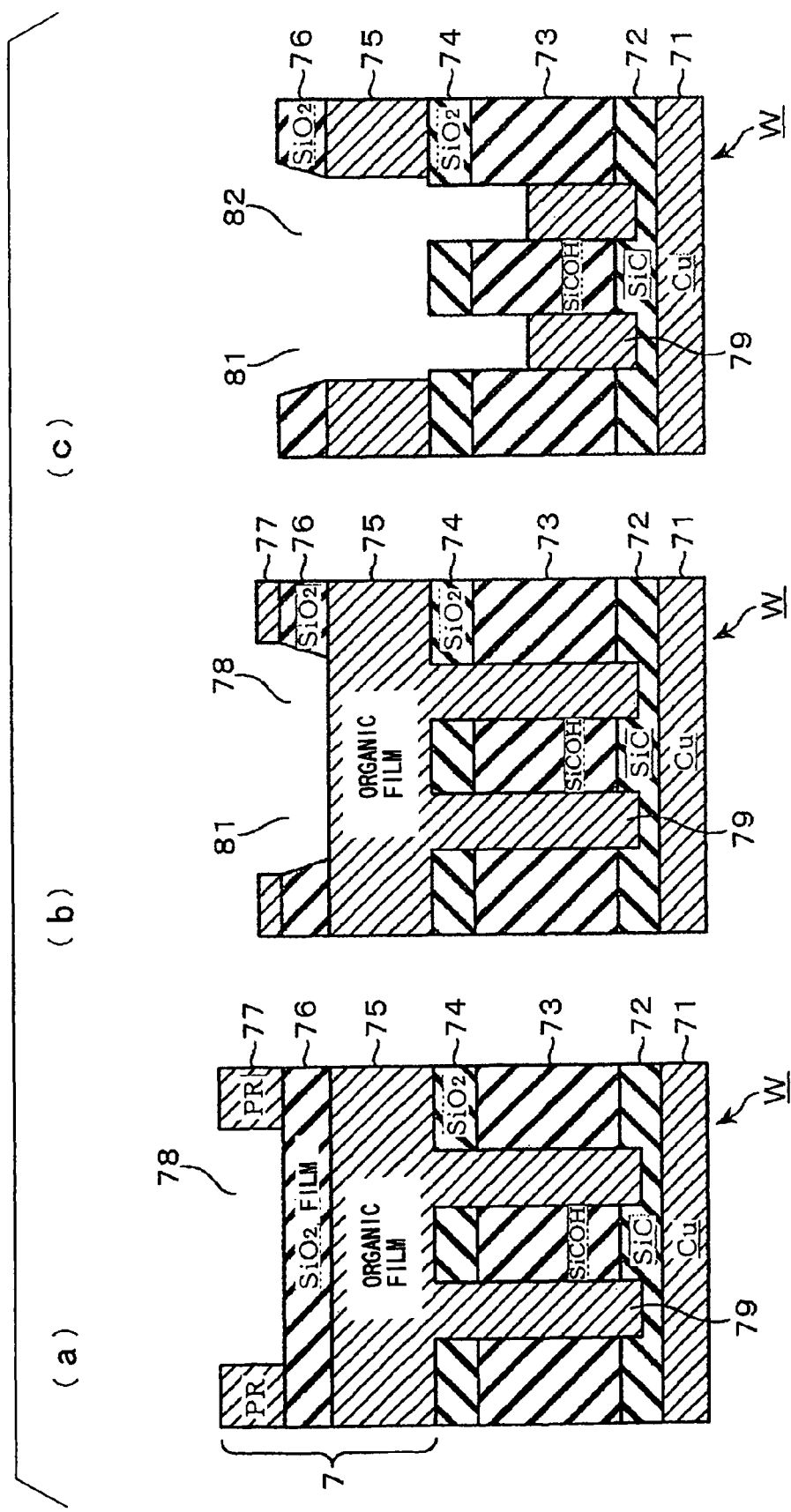
FIGS. 6(a)-6(c) are process diagrams showing how a wafer W provided with a different three-layer resist is etched.

The present invention is also applicable to the etching of a wafer W on which a film structure is formed as shown in FIG. 6(a). The film structure shown in FIG. 6(a) is designed to have dual-damascene multi-level interconnection in which not only forming the upper interconnect layer by burying metal in trenches for the upper interconnect layer but also forming via holes for connection between the lower interconnect layer and the upper interconnect layer are performed at the same time. Reference numeral 71 in the figure refers to the lower interconnect layer of copper or other metal. 72 refers to a stopper film to prevent the copper interconnect layer 71 from being etched. The stopper film 72 may be a SiC film. 73 in the figure refers to an insulating SiCOH film which is a porous film having a relative dielectric constant of, for example, 2.7 or lower and containing silicon, carbon, oxygen, and hydrogen. 74 is a hard mask made of, for example, $SiO_2$ film. The $SiO_2$ film 74 serves as a cap film to protect the porous SiCOH film 73.

75 in the figure refers to an organic film. Its composition may be the same as the organic film 42 mentioned earlier. 76 is a $SiO_2$ film serving as a hard mask. 77 is a photoresist film from which a resist pattern 78 is formed. In this example, the organic film 75, the $SiO_2$ film 76, and the photoresist film 77 constitutes a three-layer resist 7. As a sacrificial film, the organic film 75 is buried in recesses 79 which are formed in the porous SiCOH film 73 to bury electrodes therein. The resist pattern 78 is formed on the recesses 79. In this example, the recesses 79 will form the above-mentioned trenches or via holes once metal (for example, copper) is buried therein by a subsequent process.

The following describes how the above-mentioned film structure including the three-layer resist 7 is sequentially etched. Firstly, like step 1 in the previously mentioned embodiment, the $SiO_2$ film 76 is etched through the resist pattern 78 of the photoresist film 77 as a mask until the organic film 75 is exposed. Consequently, a mask pattern 81 is formed (FIG. 6(b)). Then, like step 2 in the previously mentioned embodiment, the organic film 75 is etched through the mask pattern 81. Consequently, a mask pattern 82 is formed from the organic film 75 and the remaining photoresist film 77 is removed. This etching is stopped when the remaining organic film 75 buried in the recesses 79 is reduced to a certain height (FIG. 6(c)) after the $SiO_2$ film 74 is exposed at the bottom of the mask pattern 82.

Figure 7:
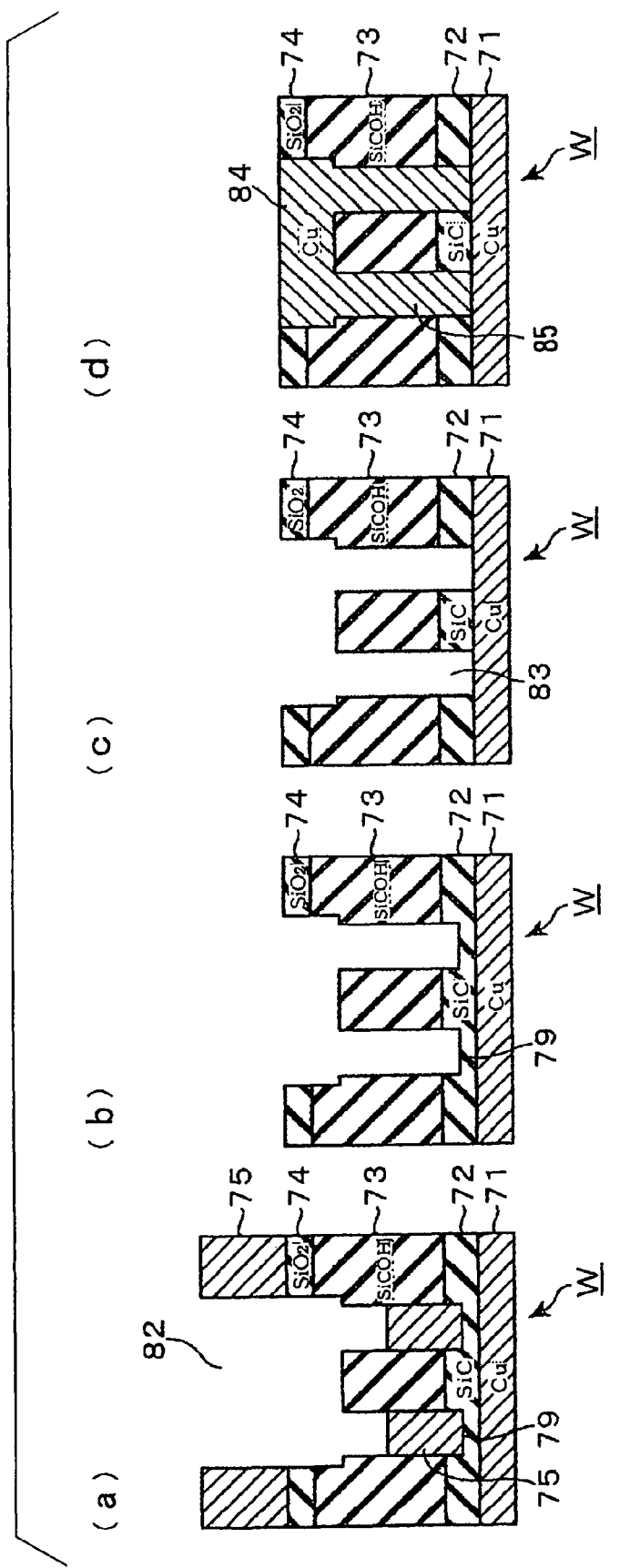
FIGS. 7(a)-7(d) are process diagrams showing how a wafer provided with a different three-layer resist is etched.

Then, $CF_4$ and other process gases are supplied to the process room 11. With these process gases excited to the plasma state, etching is performed by using the organic film 75 as a mask after the $SiO_2$ film 76 is etched off as shown in FIG. 7(a). Due to this etching, the part of the $SiO_2$ film 74 exposed to the mask pattern 82 is removed and then the part of the porous SiCOH film 83 exposed to the mask pattern 82 is thinned to a certain thickness.

Then, $N_2$ gas, $CO_2$ gas, and $H_2$ gas are supplied to the process room 11. Like the previously mentioned step 2, the organic film 75 on the $SiO_2$ film 74 and the organic film 75 buried in the recess 79 are removed as shown in FIG. 7(b) by using their mixed gas excited to the plasma state. Then, $CF_4$ and other process gases are supplied to the process room 11. With these process gases excited to the plasma state, the part of the SiC film 72 exposed in the recess 79 is etched to expose the lower interconnect layer 71 as shown in FIG. 7(c).

Copper or other metal is buried in the recess 83 formed as described above. Due to this manner, both the upper interconnect layer 84 and electrodes 85 to connect this interconnect layer 84 and the lower interconnect layer 71 are formed at the same time as shown in FIG. 7(d). In this embodiment, a mask pattern with high perpendicularity sidewalls is also fabricated from the organic film 75. This is preferable since it is possible to suppress, for example, the widening of interconnect lines in the upper interconnect layer 84. In addition, since $CO_2/H_z$ mixed gas plasma is used to etch the organic film 75 buried in the recess 79, it is possible to suppress the damage given to the SiCOH film 73 as compared with $O_2$ gas plasma-used etching.

Figure 8:
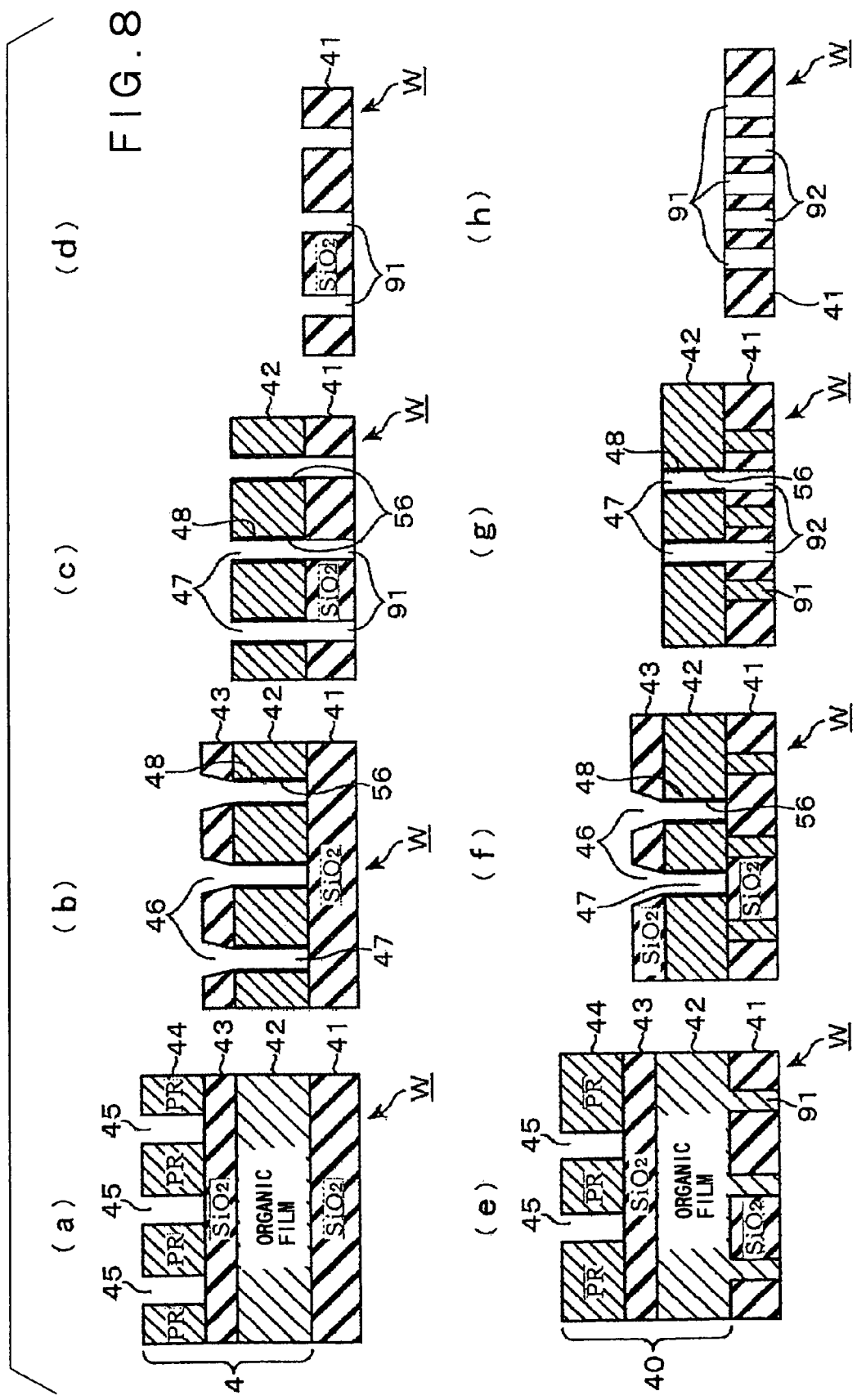
FIGS. 8(a)-8(h) are process diagrams showing how a pattern is formed by repeating a photolithography and an etching process of the present invention.

In FIG. 8, a process to fabricate another mask pattern is shown. Similar to the wafer W in FIG. 2(a), the wafer W used in this process has a three-layer resist 4 formed thereon as shown in FIG. 8(a). Firstly, according to steps 1 and 2 in the previously mentioned embodiment, a mask pattern 46 is formed from a $SiO_2$ film 43 and a mask pattern 47 is formed from an organic film 42 via the mask pattern 46 (FIG. 8(b)).

Then, with $CF_4$ gas and $C_4F_8$ gas in the plasma state as in step 1, the $SiO_2$ film 43 is removed and the $SiO_2$ film 41 is etched in the depth direction according to the mask pattern 47. In this manner, a pattern 91 is formed from the $SiO_2$ film 41 (FIG. 8(c)). Then, with a mixed gas containing $CO_2$, $H_2$, and $N_2$ in the plasma state as in step 2, the organic film 42 is removed (FIG. 8(d)).

Then, an organic film 42 is formed by applying the material so as to fill the pattern 91 with the material. Then, material for the $SiO_2$ film 43 and material for a photoresist film 44 are applied in this order to the wafer W. A three-layer resist 40 is obtained by forming a resist pattern 45 (FIG. 8(e)). The three-layer resist 40 is the same as the three-layer resist 4 except that its resist pattern 45 does not accord with the pattern 91. Then, steps 1 and 2 are performed again successively. After mask patterns 46 and 47 are formed by etching the $SiO_2$ film 43 and organic film 42 (FIG. 8(f)), the $SiO_2$ film 43 is removed and the $SiO_2$ film 41 is etched in the depth direction according to the mask pattern 47 as in step 1. In this manner, a pattern 92 is formed from the $SiO_2$ film 41 (FIG. 8(g)). Then, as in step 2, the organic film 42 is removed (FIG. 8(h)).

In the above-mentioned method, after a multi-layered resist is used for etching, another multi-layered resist is formed for another etching. Each multi-layered resist includes an organic film and an intermediate layer. The intermediate layer is provided to control the size of each aperture to be formed in the organic film when etched into a mask pattern. This prevents apertures of the mask pattern from mutually communicating due to lateral etching. Therefore, this is especially effective when a fine pattern is formed below the organic film. By applying the present invention, it is possible to more surely prevent communication between adjacent apertures since a mask pattern with high perpendicularity sidewalls is formed from the organic film.

EXAMPLES

Example 1

A wafer W having a $SiO_2$ film 41 formed thereon and a three-layer resist 4 laminated on the $SiO_2$ film 41 as shown in FIG. 2, where the previously mentioned embodiment is illustrated, was etched according to the previously mentioned procedure to form a mask pattern 47 from an organic film 42. The vertical section of the mask pattern 47 was photographed around the center and near an edge of the wafer W. The respective films which constitute the three-layer resist 4 on the processed wafer W are the same in thickness as those in the previously mentioned embodiment. As well, the resist pattern 45 is the same in dimension as that in the previously mentioned embodiment. Etching with generated plasma was performed for 60 seconds in step 1 and 52 seconds in step 2 in the previously mentioned procedure. The other conditions were the same as in the previously mentioned embodiment.

Figure 9:
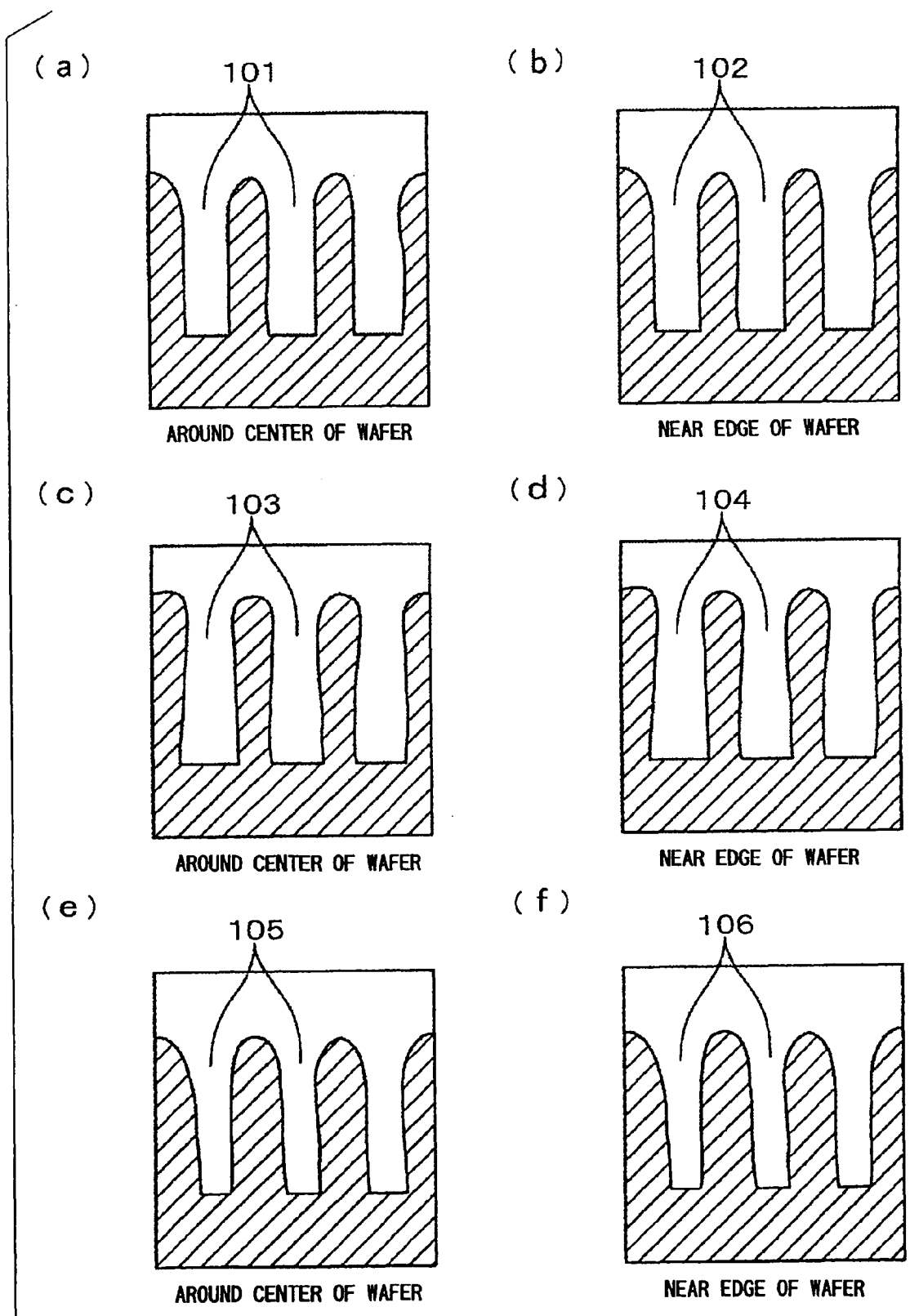
FIGS. 9(a)-9(f) are schematic views showing vertical sections of patterns formed in a typical example and comparison examples.

FIGS. 9(a) and 9(b) schematically depict the result of imaging around the center and near an edge of the etched wafer W, respectively. The line width in the pattern 101 of the organic film shown in FIG. 9(a) is 70 nm at the top, 72 nm at the bottom, and 75 nm at the middle height. The line width in the pattern 102 of the organic film shown in FIG. 9(b) is 72 nm at the top, 77 nm at the bottom, and 78 nm at the middle height. As apparent from FIGS. 9(a) and 9(b), sidewalls of the patterns 101 and 102 are highly perpendicular and the line widths are uniform regardless of the height. Although it is possible that each aperture widens laterally at the middle height like a bow and corner rounding occurs as described in [Background Art] and [Best Mode for Carrying out the Invention], such bowing and rounding were suppressed.

Comparison Example 1

A wafer W was processed as comparison example 1. After step 1 was performed in the same manner as the above-mentioned example, only $CO_2$ gas, instead of a mixed gas composed of $CO_2$, $H_2$, and $N_2$, was supplied to the wafer W in step 2. The wafer W was etched with this $CO_2$ gas in the plasma state. In step 2, except for setting the etching time set to 43 seconds, the process conditions were the same as step 2 for example 1.

FIGS. 9(c) and 9(d) schematically depict the result of photographing around the center and near an edge of the etched wafer W, respectively. The line width in the pattern 103 of the organic film shown in FIG. 9(c) is 71 nm at the top, 78 nm at the bottom, and 85 nm at the middle height. The line width in the pattern 104 of the organic film shown in FIG. 9(d) is 74 nm at the top, 81 nm at the bottom, and 82 nm at the middle height. As apparent from FIGS. 9(c) and 9(d) and these measured line widths, sidewalls of the patterns 103 and 104 have bowing profiles. From this comparison example 1 and example 1, the effect of the present invention was verified. Specifically, by using plasma created by exiting a gas containing $CO_2$ and $H_2$, a higher perpendicularity pattern can be formed from the organic film as compared with the use of plasma created from $CO_2$ gas only.

Comparison Example 2

Wafers W were processed as comparison example 2. After step 1 was performed in the same manner as the above-mentioned example 1, only $H_2$ gas and $N_2$ gas, instead of a mixed gas composed of $CO_2$, $H_2$, and $N_2$, were supplied to a wafer W and excited to the plasma state for etching in step 2. The etching time in step 2 was changed for each wafer W. After etching was complete, the vertical section of each wafer W was examined to determine the etching time required to reach the same depth as in the patterns 101 and 102. Except for the supplied gas and etching time, the etching conditions were the same as for step 2 in example 1.

According to the result of the above experiment, a wafer W which was etched for 144 seconds showed the same depth as in the patterns 101 and 102 of example 1. Using a gas which contains $H_2$ without $CO_2$ lead to extending the etching time. This may be because H+ ions and others generated as the result of exciting $H_2$ gas to the plasma state are low in mass and their etching action on the wafer W is small. As apparent from the result of this experiment, it is preferable to supply a process gas containing $H_2$ and $CO_2$, rather than a process gas containing $H_2$ without $CO_2$, and excite the process gas to the plasma state for etching since it is possible to shorten the etching time and raise the throughput if $CO_2$ is contained. FIGS. 9(e) and 9(f) schematically depict the result of photographing around the center and near an edge of the 144 second-etched wafer W, respectively. The line width in the pattern 105 of the organic film shown in FIG. 9(e) is 55 nm at the top, 54 nm at the bottom, and 58 nm at the middle height. The line width in the pattern 106 of the organic film shown in FIG. 9(f) is 55 nm at the top, 49 nm at the bottom, and 54 nm at the middle height. In the figure, the patterns 105 and 106 show remarkable corner rounding. Example 1 is preferable also in view of the pattern shape.

What is claimed is:
1. A method for manufacturing a semiconductor device, comprising the steps of:

preparing a substrate provided with an etching-target film thereon and a multi-layered resist on the etching-target film, including an organic film and a resist film developed into a resist pattern; and forming the organic film of the multi-layered resist into a mask pattern by etching the organic film through the resist pattern of the resist film wherein plasma obtained by exciting a process gas containing carbon dioxide and hydrogen to the plasma state is used to etch the organic film and the mask pattern of the organic film is to be used in etching the etching-target film, wherein a low dielectric constant film which has a recess and contains silicon, carbon, oxygen, and hydrogen is formed between the multi-layered resist and the etching-target film on the substrate and the organic film of the multi-layered resist is buried in the recess of the low dielectric constant film.

2. A method for manufacturing a semiconductor device according to claim 1 wherein the organic film serves as a sacrificial film.

3. A method for manufacturing a semiconductor device according to claim 1 wherein the recess of the low dielectric constant film becomes a via hole where an electrode is buried to connect an upper interconnect layer and a lower interconnect layer in a multi-level interconnection structure.

4. A method for manufacturing a semiconductor device according to claim 1 wherein the organic film is composed mainly of carbon.

* * * * *